United States Patent
Song et al.

(10) Patent No.: US 10,076,801 B2
(45) Date of Patent: Sep. 18, 2018

(54) SEMICONDUCTOR PACKAGE AND METHOD OF MANUFACTURING THE SAME

(71) Applicant: Samsung Electronics Co., Ltd., Suwon-si, Gyeonggi-do (KR)

(72) Inventors: Min-woo Song, Daejeon (KR); Sung-il Cho, Asan-si (KR); Se-gi Byun, Daejeon (KR); Jin Yu, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/443,347

(22) Filed: Feb. 27, 2017

(65) Prior Publication Data
US 2017/0246699 A1    Aug. 31, 2017

(30) Foreign Application Priority Data
Feb. 29, 2016    (KR) ........................ 10-2016-0024709

(51) Int. Cl.
*B23K 1/20*    (2006.01)
*H01L 21/48*    (2006.01)
(Continued)

(52) U.S. Cl.
CPC ................ *B23K 1/203* (2013.01); *B23K 1/19* (2013.01); *C01B 31/022* (2013.01);
(Continued)

(58) Field of Classification Search
CPC ........ B23K 1/203; B23K 1/19; C01B 31/022; H01L 24/81; H01L 24/16; H01L 23/4985;
(Continued)

(56) References Cited

U.S. PATENT DOCUMENTS

| 7,780,939 B2 | 8/2010 | Margrave et al. |
| 8,100,314 B2 | 1/2012 | Suh |

(Continued)

FOREIGN PATENT DOCUMENTS

| JP | 2010029875 A | 2/2010 |
| JP | 2015014019 A | 1/2015 |

(Continued)

OTHER PUBLICATIONS

L.E.Evseeva and S. A. Taneva "Thermal Conductivity of Micro-and Nanostructural Epoxy Composites at Low Temprature", Mechanics of Composite Materials, vol. 44, No. 1, 2008.

(Continued)

*Primary Examiner* — Kyoung Lee
(74) *Attorney, Agent, or Firm* — Harness, Dickey & Pierce, P.L.C.

(57) ABSTRACT

A method of manufacturing a semiconductor package including coating a flux on a connection pad provided on a first surface of a substrate, the flux including carbon nanotubes (CNTs), placing a solder ball on the connection pad coated with the flux, forming a solder layer attached to the connection pad from the solder ball through a reflow process, and mounting a semiconductor chip on the substrate such that the solder layer faces a connection pad in the semiconductor chip may be provided.

19 Claims, 16 Drawing Sheets

(51) Int. Cl.
  *H01L 23/498* (2006.01)
  *H01L 23/00* (2006.01)
  *C01B 31/02* (2006.01)
  *B23K 1/19* (2006.01)
  *B82Y 40/00* (2011.01)
  *B82Y 30/00* (2011.01)

(52) U.S. Cl.
  CPC ...... *H01L 21/4853* (2013.01); *H01L 21/4864* (2013.01); *H01L 23/4985* (2013.01); *H01L 23/49838* (2013.01); *H01L 24/16* (2013.01); *H01L 24/81* (2013.01); *B82Y 30/00* (2013.01); *B82Y 40/00* (2013.01); *H01L 2224/16227* (2013.01); *H01L 2224/81024* (2013.01); *H01L 2224/81815* (2013.01); *H01L 2224/81911* (2013.01); *Y10S 977/742* (2013.01); *Y10S 977/745* (2013.01); *Y10S 977/75* (2013.01); *Y10S 977/752* (2013.01); *Y10S 977/842* (2013.01); *Y10S 977/89* (2013.01); *Y10S 977/932* (2013.01)

(58) Field of Classification Search
  CPC ........... H01L 23/49838; H01L 21/4864; H01L 21/4853; H01L 2224/81024; H01L 2224/81815; H01L 2224/16227; Y10S 977/932; Y10S 977/842; Y10S 977/752; Y10S 977/75; Y10S 977/745; Y10S 977/742
  See application file for complete search history.

(56) References Cited

U.S. PATENT DOCUMENTS

| 2013/0298960 | A1 | 11/2013 | Kim |
| 2014/0256840 | A1 | 9/2014 | Chow et al. |
| 2015/0004750 | A1* | 1/2015 | Chi ........................ H01L 24/82 438/108 |

FOREIGN PATENT DOCUMENTS

| KR | 20100086682 A | 8/2010 |
| KR | 101062730 B1 | 9/2011 |
| KR | 101205839 B1 | 11/2012 |
| KR | 20130042241 A | 4/2013 |
| KR | 20130125220 A | 11/2013 |

OTHER PUBLICATIONS

Mou'ad A. Tarawneh and Sahrim HJ. Ahmad Characterization and Morphology of Modified Multi-Walled Carbon Nanotubes Filled Thermoplastic Natural Rubber (TPNR) Composite Intech, 2013.

* cited by examiner

US 10,076,801 B2

SEMICONDUCTOR PACKAGE AND METHOD OF MANUFACTURING THE SAME

CROSS-REFERENCE TO RELATED APPLICATION

This application claims the benefit of Korean Patent Application No. 10-2016-0024709, filed on Feb. 29, 2016, in the Korean Intellectual Property Office, the disclosure of which is incorporated herein in its entirety by reference.

BACKGROUND

The inventive concepts relate to semiconductor packages and/or methods of manufacturing the semiconductor package, and more particularly, to methods of manufacturing a semiconductor package by using a flux and/or semiconductor packages manufactured by using the method.

According to the rapid development of the electronic industry, user demand for miniaturized and multifunctional electronic devices has increased. Accordingly, user demand for miniaturized and multifunctional semiconductor devices for use in such electronic device has also increased. Thus, a semiconductor device having a connection terminal of a finer pitch is required. However, due to a reduction in sizes of solder balls connected to the connection terminal of the fine pitch, a bonding defect may easily occur in a process of attaching the solder balls. Thus, providing a reliable electric connection between the semiconductor device and an external device is becoming more and more challenging.

SUMMARY

The inventive concepts provide methods of manufacturing a semiconductor package, in which an incidence of a bonding defect during a solder ball reflow process can be minimized or prevented, and/or semiconductor packages manufactured by using the method.

According to an example embodiment, a method of manufacturing a semiconductor package may include coating a flux on a connection pad provided on a first surface of a substrate, the flux including carbon nanotubes (CNTs), placing a solder ball on the connection pad coated with the flux, forming a solder layer attached to the connection pad from the solder ball through a reflow process, and mounting a semiconductor chip on the substrate such that the solder layer faces a connection pad in the semiconductor chip.

According to an example embodiment, a method of manufacturing a semiconductor package may include coating a flux on a connection pad provided on a first surface of a substrate, the flux including carbon nanotubes (CNTs), a hydrophilic functional group being attached to the CNTs, placing a solder ball on the connection pad coated with the flux, forming a solder layer attached to the connection pad from the solder ball through a reflow process, and mounting a semiconductor chip on the substrate such that the solder layer faces a connection pad provided in the semiconductor chip.

According to an example embodiment, a method of manufacturing a semiconductor package may include providing a connection pad on a surface of a substrate, coating a flux on the connection pad, the flux including a flux agent having carbon nanotubes (CNTs) and a hydrophilic functional group attached to the CNTs, placing a solder ball on the connection pad coated with the flux, performing a reflow process to the solder ball such that the solder ball contacts the connection pad through the flux and the flux at least partially covers lower sides of sidewalls of the solder ball and the substrate, and mounting a semiconductor chip on the substrate such that a reflowed structure of the solder ball faces a connection pad in the semiconductor chip

BRIEF DESCRIPTION OF THE DRAWINGS

Example embodiments of the inventive concepts will be more clearly understood from the following detailed description taken in conjunction with the accompanying drawings in which.

DETAILED DESCRIPTION

FIGS. 1 through 9 are cross-sectional views for describing a method of manufacturing a semiconductor package according to an example embodiment.

Figure 1:
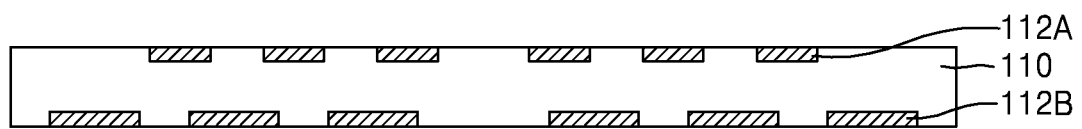
FIGS. 1 through 9 are cross-sectional views for describing a method of manufacturing a semiconductor package according to an example embodiment.

Referring to FIG. 1, a substrate 110 having conductive pads 112A and 112B may be provided.

In some example embodiments, the substrate 110 may be a printed circuit board (PCB), a flexible printed circuit board (FPCB), or an interposer. The substrate 110 may have a stack structure in which various material layers are stacked. The material layers may include one or more metal wiring layers and/or one or more prepreg layers. The metal wiring layers may include metal, for example, copper (Cu), gold (Au), platinum (Pt), silver (Ag), nickel (Ni), and/or aluminum (Al), however, example embodiments are not limited thereto.

Although not shown, a solder resist layer may be further formed on an upper surface of the substrate 110. The solder resist layer may be formed on both the upper surface and a lower surface of the substrate 110 or either the upper surface or the lower surface thereof. The solder resist layer may include, for example, acrylic resin, epoxy resin, urethane resin, silicon resin, paraxylene resin, or parylene resin. The solder resist layer may protect the substrate 110 from mechanical damages, prevent corrosion thereof, and improve an electrical characteristic thereof.

A first connection pad 112A may be formed on the upper surface of the substrate 110 for an electrical connection to a semiconductor chip mounted on the upper surface.

The first connection pad 112A may be a conductive pad, for example, a metal pad. In some example embodiments, the first connection pad 112A may include at least one of copper (Cu), nickel (Ni), aluminum (Al), gold (Au), platinum (Pt), or silver (Ag). For example, the first connection pad 112A may include copper (Cu). For example, the first connection pad 112A may have a double layer structure of nickel (Ni) and gold (Au).

A second connection pad 112B may be formed on the lower surface of the substrate 110 for an electrical connection to an external device. The second connection pad 112B may also be a conductive pad, for example, a metal pad, like the first connection pad 112A. In some example embodiments, the second connection pad 112B may include at least one of copper (Cu), nickel (Ni), aluminum (Al), gold (Au), platinum (Pt), or silver (Ag). For example, the second connection pad 112B may include copper (Cu). For example, the second connection pad 112B may have a double structure of nickel (Ni) and gold (Au).

In some example embodiments, a passivation layer (not shown) including an organic solderability preservative (OSP) may be further formed on the upper surfaces of the first and second conductive pads 112A and 112B. For example, when the first and second conductive pads 112A and 112B include copper, and copper is exposed at uppermost surfaces of the first and second conductive pads 112A and 112B, the passivation layer including an organic compound (e.g., benzotriazole or imidazole) may be attached to the copper exposed at uppermost surfaces of the first and second conductive pads 112A and 112B and forms a chemical bond with the exposed copper. The passivation layer may prevent an undesired oxidation from occurring on surfaces of the first and second conductive pads 112A and 112B, or prevent the surfaces of the first and second conductive pads 112A and 112B from being damaged. For example, the passivation layer may have a thickness ranging from about several tens to about several hundreds of nanometers.

Figure 2:
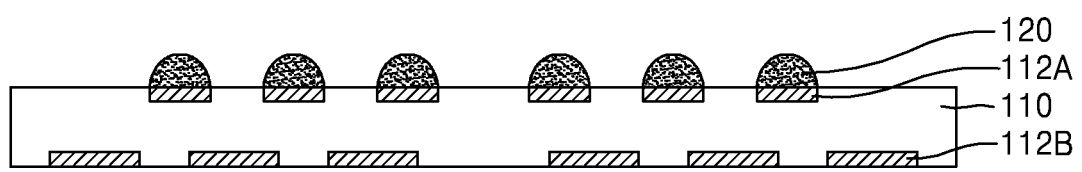

Referring to FIG. 2, a flux 120 may be coated on the first connection pad 112A.

The flux 120 may remove an oxide layer, for example, a copper oxide layer, formed on the first connection pad 112A and prevent the first connection pad 112A from being re-oxidized such that a stable bonding is provided between the first connection pad 112A and solder balls 130 (see FIG. 3), which will be placed on the flux 120 in a subsequent process.

In some example embodiments, the flux 120 may include a flux agent containing carbon nanotubes (CNTs) 122 (see FIG. 12) of a desired (or alternatively, predetermined) concentration. The flux agent may include a rosin-based flux (e.g., active rosin or inactive rosin), a water soluble flux (e.g., acids, salts, or amins), an organic flux (e.g., glutamic acid hydrochloride or ethylenediamine stearic acid hydrochloride), and an inorganic flux zinc chloride or zinc chloride-ammonium chloride). However, types of the flux agent are not limited thereto.

For example, when the flux agent is the rosin-based flux, the flux agent may include resin, an activation agent, and a solvent. The resin may be rosin or rosin derivatives, and may include the flux agent, for example, ranging from about 10 to about 50 wt % in the flux. The activation agent may be at least one of carboxylic acid, sulfonic acid, phosphoric acid, amino acid, or alkanolamine, and may constitute about 0.1 wt % to about 10 wt % of the flux. The solvent may be at least one of a glycol ether ester compound, a glycol ester compound, an ester compound, a ketone compound, or a cyclic ester compound, and may constitute about 10 to about 90 wt % of the flux. However, types and composition of the flux agent and solvent are not limited thereto.

In some example embodiments, the flux 120 may include the flux agent containing the CNTs 122 of about 0.01 to about 1 wt %. For example, the flux 120 may include the flux agent containing the CNTs 122 of about 0.4 to about 0.8 wt %. When the flux 120 includes the CNTs 122 of about 0.4 to about 0.8 wt %, a wettability characteristic of the flux 120 may be further enhanced, thereby preventing a bonding defect between the first and second conductive pads 112A and 112B and the solder balls during a subsequent solder ball reflow process. In this regard, the content of the CNTs 122 and the wettability characteristic of the flux 120 will be described in detail with reference to FIGS. 13A through 14B.

In some example embodiments, the flux 120 may include the CNTs 122 to which hydrophilic functional groups are attached. For example, hydrophilic functional groups may be attached to a surface of the CNTs 122 such that the CNTs 122 may be uniformly distributed in the flux agent.

In some example embodiments, the CNTs 122 may include single wall CNTs, double wall CNTs, multi-wall CNTs, or CNT ropes. A diameter of the CNTs 122 may range from several to several hundreds of nanometers. A length of the CNTs 122 may range from several tens of nanometers to several tens of micrometers. However, the diameter and the length of the CNTs 122 are not limited thereto.

In some example embodiments, the hydrophilic functional groups may include a hydroxy group, an alkoxy group, a nitro group, a cyano group, an amino group, an azido group, an amidino group, a hydrazino group, a hydrazono group, a carbonyl group, a carbamyl group, a thiol group, an allylamin group, an ether group, an ester group, a carboxyl group, salt of the carboxyl group, a sulfonic acid group, a trimethoxysilane group ($-Si(OCH_3)_3$), and/or a trichlorosilane group ($-SiCl_3$), but the inventive concepts are not limited thereto.

Figure 12:
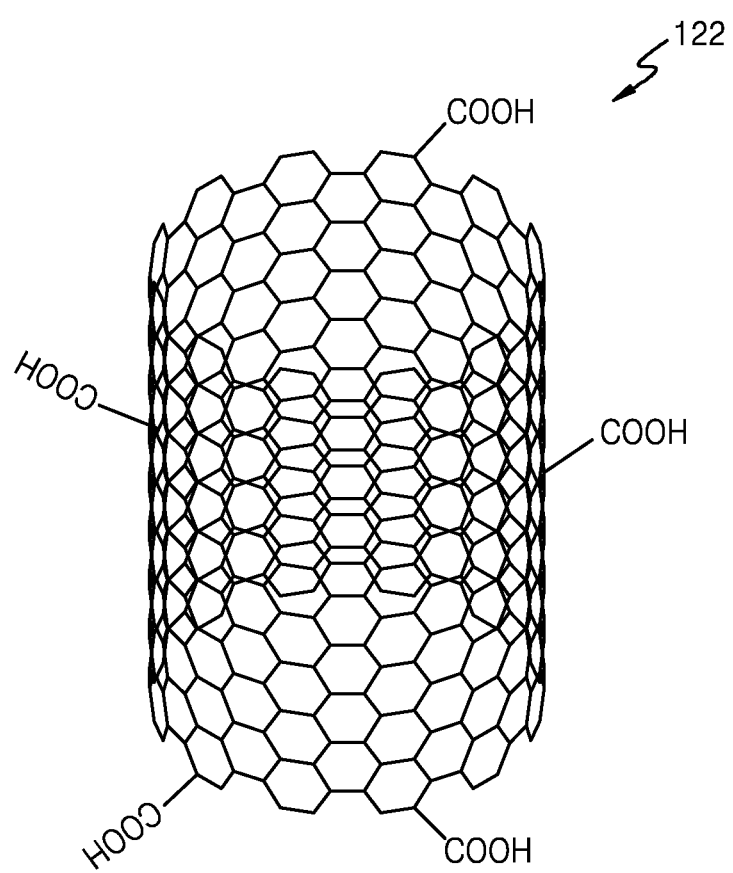
FIG. 12 is a schematic view of a structure of carbon nanotubes (CNTs) according to an example embodiment.

FIG. 12 is a schematic view of a structure of the CNTs 122 according to an example embodiment. As shown in FIG. 12, the flux 120 may include the single wall CNTs 122 having side walls and edges to which the carboxyl group ($-COOH$) is attached. However, the inventive concepts are not limited thereto. Unlike FIG. 12, one of hydrophilic functional groups excluding the carboxyl group among the above-described hydrophilic functional groups may be attached to the CNTs 122. Unlike FIG. 12, two or more hydrophilic functional groups selected from the above-described hydrophilic functional groups may be attached to the CNTs 122.

In some example embodiments, the CNTs 122 to which a hydrophilic functional group is attached may be prepared when a stabilizing solution in which CNTs are dispersed is acidized. For example, the stabilizing solution may be formed by dispersing the CNTs of a desired (or alternatively, predetermined) concentration in an organic solvent. Thereafter, the stabilizing solution may be acidized by adding thereto one or more selected from nitric acid, sulfuric acid, hydrochloric acid, and perchloric acid. The stabilizing solution may be acidized at a temperature ranging from about 20° C. to about 200° C. for several tens of minutes to several hours. While the stabilizing solution is acidized, the hydrophilic functional group may be attached to the edges or the side walls of the CNTs 122. Thereafter, at least one of filtering the acidized solution, or annealing for removing remaining amorphous carbon may be selectively performed to obtain the CNTs 122 to which the hydrophilic functional group is attached.

According to an example process for manufacturing the CNTs to which the carboxyl group is attached, single wall CNTs may be put in a stabilizing solution containing nitric acid and sulfuric acid in a molar ratio of 1:3, and the stabilizing solution may be ultrasound-mixed at a temperature ranging from about 100° C. to about 140° C. for one to three hours. However, the process for manufacturing the CNTs to which the hydrophilic functional group is attached is not limited thereto.

Referring to FIG. 2, the flux 120 may be disposed on an entire upper surface of the first connection pad 112A. In FIG. 2, the flux 120 is disposed on the entire upper surface of the first connection pad 112A and is not disposed on the surface of the substrate 110 around the first connection pad 112A, but the inventive concepts are not limited thereto. Unlike FIG. 2, the flux 120 may be disposed to cover the entire upper surface of the first connection pad 112A and the surface of the substrate 110 around the first connection pad 112A.

As shown in FIG. 2, the flux 120 may be disposed to have a contact angle smaller than about 60 degrees with the first connection pad 112A and/or the upper surface of the substrate 110. However, the contact angle of the flux 120 is not limited thereto. A contact angle characteristic of the flux 120 will be described with reference to FIGS. 13A and 13B.

CNTs having a hydrophobic property may not be uniformly dispersed in a solvent or a viscosity polymer melt, and tend to agglomerate to each other. Thus, CNTs may not be uniformly dispersed although added to water soluble flux. However, the CNTs 122 manufactured by using the above-described method and having side walls and edges to which a hydrophilic functional group is attached may be uniformly dispersed in water soluble flux. The flux 120 containing the CNTs 122 to which the hydrophilic functional group is attached having content ranging from about 0.01 to about 1 wt % of the flux may have an enhanced wettability characteristic. Thus, for example, although the flux 120 having a relatively small amount is provided on the upper surface of the first connection pad 112A due to a tolerance of dotting facility of the flux 120, the flux 120 may be disposed to cover the entire upper surface of the first connection pad 112A due to an improved wettability characteristic of the flux 120 as shown in FIG. 2. Thus, although solder balls 130 (see FIG. 3) are misaligned or locations thereof are moved during a subsequent process, contact between the solder balls 130 and the flux 120 may be secured.

Figure 3:
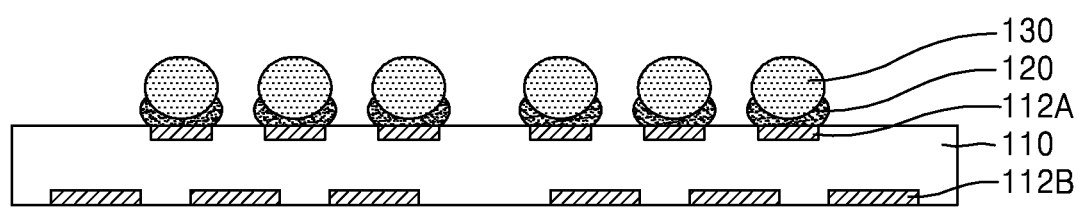

Referring to FIG. 3, the solder balls 130 may be disposed on the first connection pad 112A coated with the flux 120.

In some example embodiments, the solder balls 130 may have a globular or ball shape. The solder balls 130 may include tin (Sir), indium (In), bismuth (Bi), antimony (Sb), copper (Cu), silver (Ag), lead (Pb), and/or an alloy of these. For example, the solder balls 130 may include Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, and/or Sn—Bi—Zn.

Because the solder balls 130 are disposed on the first connection pad 112A coated with the flux 120, lower sides of side walls of the solder balls 130 may contact the flux 120. Because the flux 120 have the improved wettability characteristic, a contact area between the solder balls 130 and the flux 120 may be relatively large. When viscosity of the flux 120 is relatively small, unlike FIG. 3, the flux 120 may surround surfaces of the solder balls 130 such that the flux 120 covers substantially entire surfaces of the solder balls 130.

Figure 4:
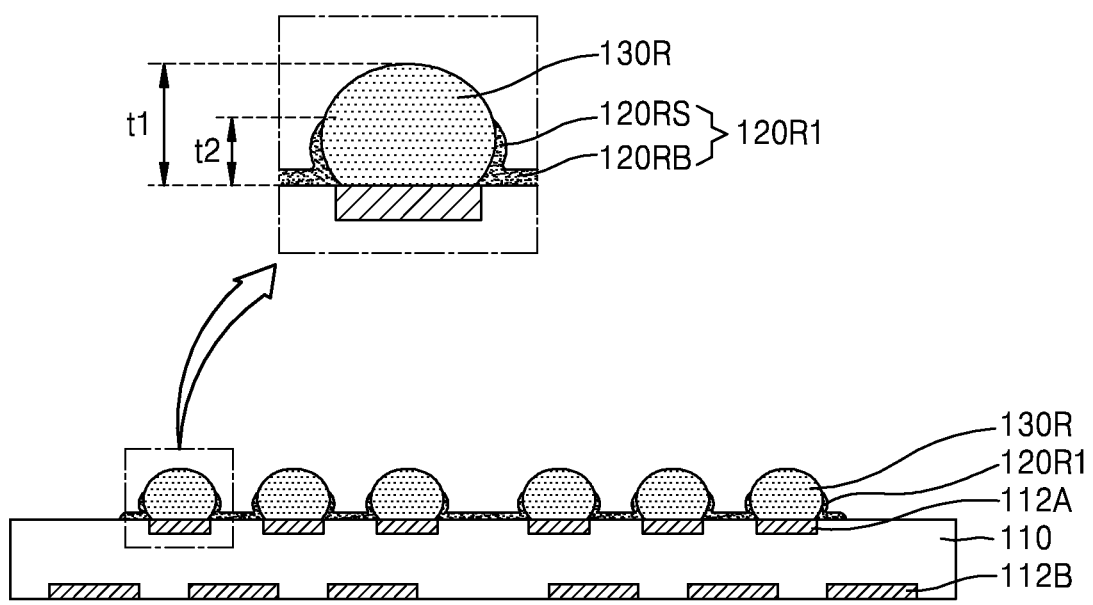

Referring to FIG. 4, a reflow process may be performed to form a first solder layer 130R on the first connection pad 112A.

The reflow process may be performed at a temperature ranging from about 200° C. to about 280° C. for several seconds to several minutes. For example, a preheating temperature ranging from about 150° C. to about 180° C. may be maintained for several tens of seconds, and a temperature of 200° C., which is less than a peak temperature of 260° C., may be maintained for several seconds. A condition of the reflow process may be properly selected according to an alloy composition of the first solder layer 130R.

An intermediate layer (not shown) may be formed on a contact interface between the first solder layer 130R and the first connection pad 112A through the reflow process. The intermediate layer may include an intermetallic compound (IMC) formed when metal materials included in the first solder layer 130R and the first connection pad 112A react at a relatively high temperature. For example, when the first connection pad 112A includes copper and/or nickel, and the first solder layer 130R includes tin and/or copper, the intermediate layer may include at least one of $(Cu, Ni)_6Sn_5$, $(Cu, Ni)_3Sn_4$, or $(Cu, Ni)_3Sn$. However, a material or a composition of the intermediate layer is not limited thereto, and may be different according to, for example, materials of the first solder layer 130R and the first connection pad 112A and/or a temperature and time of the reflow process.

The flux 120 may enable the intermediate layer to be stably formed between the first solder layer 130R and the first connection pad 112A at the interface between the first solder layer 130R and the first connection pad 112A by removing an oxide layer formed by, for example, an undesired oxidation of the first connection pad 112A.

When a passivation layer including an OSP is further formed on the first conductive pad 112A, the passivation layer may include, for example, a copper complex compound formed through a coordinate bond with copper elements included in the first connection pad 112A. In the event that the passivation layer is not completely removed before the reflow process, because a contact area between the first solder layer 130R and the first connection pad 112A may be reduced, a stable bonding between the first solder layer 130R and the first connection pad 112A may be difficult.

However, according to some example embodiments, the flux 120 may include the CNTs 122 to which a hydrophilic functional group is attached, and thus the flux 120 may have an improved wettability characteristic. Therefore, the flux 120 can be provided on, for example, an entire area of the first connection pad 112A, and remove the oxide layer formed by the undesired oxidation of the first connection pad 112A. Thus, the contact area between the first solder layer 130R and the first connection pad 112A may increase due to a substantially complete removal of the oxide layer, which is formed on the first connection pad 112A or the passivation layer. Because the flux 120 is deformed to cover lower sides of side walls of the solder balls 130 in the reflow process, an undesired oxide layer formed on side walls of the first solder layer 130R may also be removed. Thus, more stable bonding may be provided between the first solder layer 130R and the first connection pad 112A.

According to some example embodiments, the flux 120 may include the CNTs 122 to which a hydrophilic functional group is attached, and thus the flux 120 may have a relatively high heat conductivity. Because CNTs have a high heat conductivity of about 3000 W/m·K, in the case where about 1 wt % of CNTs are added to a polymer matrix, a heat conductivity may increase about 50% to about 200% compared to the case where no CNTs are added to the polymer matrix. Meanwhile, when a content of CNTs is greater than about 1 wt %, CNTs contained in the polymer matrix may not be uniformly dispersed, and contact thermal resistance between CNTs may increase, thereby reducing heat conductivity of the polymer matrix. According to some example embodiments, the flux 120 may include the CNTs 122 of about 0.01 wt % to about 1.0 wt % and may have an increased heat conductivity. Thus, during the reflow process, heat may be quickly transferred to surfaces of the solder balls 130 through the flux 120, and thus more stable bonding may be possible between the first solder layer 130R and the first connection pad 112A.

After the reflow process, a flux remaining layer 120R1 may remain on a part of the side walls of the first solder layer 130R. The flux remaining layer 120R1 may also remain on the upper surface of the first connection pad 112A and/or an upper surface of the substrate 110 around the first connection pad 112A. As shown in FIG. 4, the flux remaining layer 120R1 may include a side wall part 120RS disposed on the part of the side walls of the first solder layer 130R and a bottom part 120RB disposed on the upper surface of the substrate 110. The flux remaining layer 120R1 may include a flux agent included in the flux 120 after evaporating a solvent through a high temperature of the reflow process. The CNTs 122 dispersed and present in the flux 120 may also be included in the flux remaining layer portion 120R1.

In some example embodiments, the side wall part 120RS of the flux remaining layer portion 120R1 may have a height t2 smaller than a height t1 of the first solder layer 130R and may be disposed on the side walls of the first solder ball 130R. The height t2 of the side wall part 120 5RS of the flux remaining layer 120R1 may be smaller than the height t1 of the first solder layer 130R by 70%, but the inventive concepts are not limited thereto. For example, as the flux 120 has an improved wettability characteristic, the height t2 of the side wall part 120RS of the flux remaining layer 120R1 may increase.

The flux remaining layer 120R1, which has a considerable thickness and is continuously formed on the side walls of the first solder layer 130R, and the upper surface of the substrate 110, is exaggerated for convenience of description in FIG. 4. Unlike FIG. 4, the flux remaining layer 120R1 may have a very small thickness and/or may be discontinuously formed on the side walls of the first solder layer 130R and the upper surface of the substrate 110.

Optionally, a process of cleaning the flux remaining layer 120R1 may be performed to remove the flux remaining layer 120R1 attached onto the upper surface of the substrate 110 and the side walls of the first solder layer 130R. A well-known flux cleaning agent may be used in the cleaning process.

Figure 5:
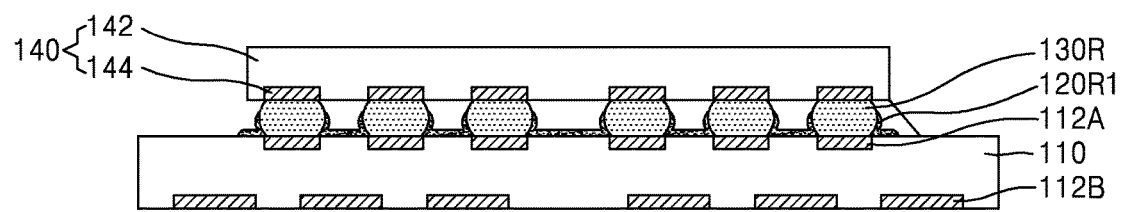

Referring to FIG. 5, a semiconductor chip 140 may be mounted on the substrate 110.

The semiconductor chip 140 may include a semiconductor substrate 142 and a connection pad 144 provided on an active surface of the semiconductor substrate 142.

In some example embodiments, the semiconductor substrate 142 may be a silicon (Si) substrate. In some example embodiments, the semiconductor substrate 142 may include a semiconductor element such as germanium (Ge) or a compound semiconductor (e.g., silicon carbide (SiC), gallium arsenide (GaAs), indium arsenide (InAs), or indium phosphide (InP)). In at least one example embodiment, the semiconductor substrate 142 may have a silicon on insulator (SOI) structure. For example, the semiconductor substrate 142 may include a buried oxide (BOX) layer. In some example embodiments, the semiconductor substrate 142 may include a conductive region, for example, a well doped with impurities or a structure doped with impurities. The semiconductor substrate 142 may have various isolation structures such as a shallow trench isolation (STI) structure.

Various semiconductor devices may be provided in the active surface of the semiconductor substrate 142. The semiconductor devices may include a memory device, a core circuit device, a peripheral circuit device, a logic circuit device, or a control circuit device. An example of the memory device may include a semiconductor memory device (e.g., DRAM, SRAM, or a nonvolatile memory device). The nonvolatile memory device may include, for example, EPROM, EEPROM, or flash EEPROM. In some example embodiments, system large-scale integration (LSI), an image sensor such as a CMOS imaging sensor (CIS), a micro-electro-mechanical system (MEMS), an active device, or a passive device may be provided in the active surface of the semiconductor substrate 142.

A wiring layer (not shown) may be provided on the semiconductor devices in the active surface of the semiconductor substrate 142. The wiring layer may include a wiring pattern and an insulating layer. The wiring pattern may be electrically connected to the connection pad 144 that is an electrode terminal.

As shown in FIG. 5, the active surface of the semiconductor substrate 142 may be provided in a lower direction such that the connection pad 144 faces the first solder layer 130R.

Thereafter, the reflow process may be performed to bond the first solder layer 30R and the connection pad 144 to each other.

Figure 6:
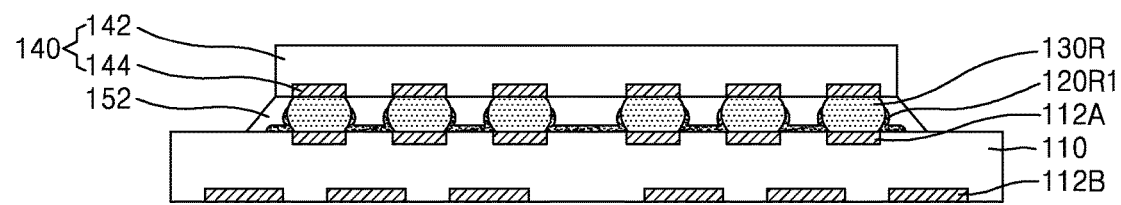

Referring to FIG. 6, an underfill layer 152 may be formed in a space between the semiconductor chip 140 and the substrate 110. The underfill layer 152 may surround side walls of the first solder layer 130R and/or the flux remaining layer 120R1 to fill spaces between the neighboring first solder layers 130R.

Figure 7:
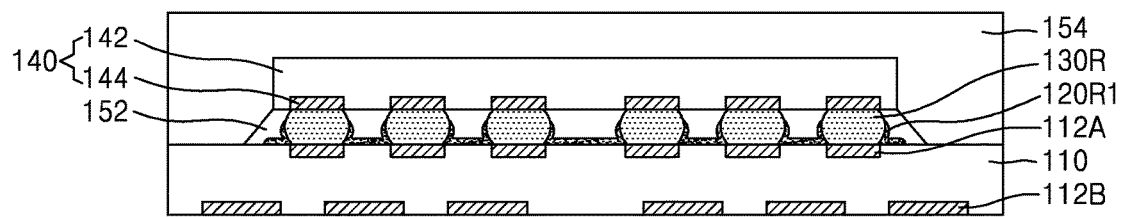

Referring to FIG. 7, a molding material 154 may be formed to surround an upper surface and side walls of the semiconductor chip 140. The molding material 154 may be formed using, for example, an epoxy mold compound (EMC).

Meanwhile, as described with reference to FIGS. 6 and 7, the underfill layer 152 may not be formed but the molding layer 154 may be formed to surround the upper surface and the side walls of the semiconductor chip 140 and the side walls of the first solder layer 130R and/or the flux remaining layer 120R1 to fill the spaces between the neighboring first solder layers 130R.

Figure 8:
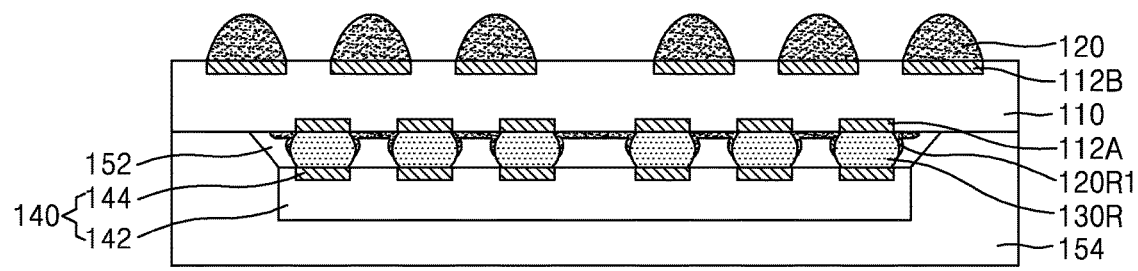

Referring to FIG. 8, a bonded structure of the substrate 110 and the semiconductor chip 140 may be upside down such that a lower surface of the substrate 110, e.g., the surface of the substrate 112 through which the second connection pad 112B is exposed faces upward.

Thereafter, the flux 120 may be coated on the second connection pad 112B. In some example embodiments, the flux 120 may include the CNTs 122 to which a hydrophilic functional group is attached. A technical characteristic of the flux 120 is described with reference to FIG. 2 above.

Figure 9:
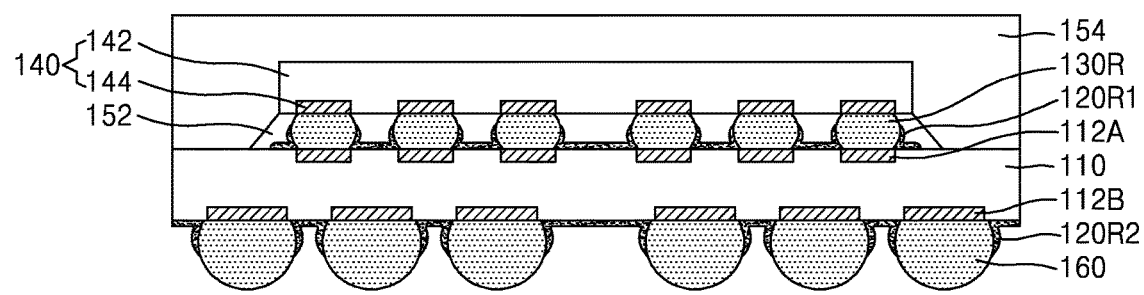

Referring to FIG. 9, solder balls (not shown) may be provided on the second connection pad 112B on which the flux 120 is coated. Thereafter, a reflow process may be performed to attach the solder balls to the second connection pad 112B and form a second solder layer 160 on the second connection pad 112B. Meanwhile, a flux remaining layer 120R2 may be formed on side walk of the second solder layer 160 and a surface of the substrate 110 around the second connection pad 112B. A characteristic of the flux remaining layer 120R2 may be the same as or similar to that of the flux remaining layer 120R1 described with reference to FIG. 5 above.

The above-described process may be performed to completely manufacture the semiconductor package 100.

According to a method of manufacturing the semiconductor package 100, a flux including the CNTs 122 to which a hydrophilic functional group is attached may be coated on a connection pad 112A (and/or a connection pad 112B). The flux including the CNTs 122 to which the hydrophilic functional group is attached may have an enhanced wetability characteristic and thus a bonding defect between the connection pad and solder balls may be prevented in a solder ball reflow process. The flux including the CNTs 122 may have an enhanced heat conductivity. Thus, surfaces of solder balls contacting the flux may be more quickly melted in the solder ball reflow process, thereby preventing the bonding defective between the connection pad and solder balls. According to the method of manufacturing the semiconductor package 100, a reliable electrical connection between a semiconductor chip and a substrate may be provided.

A surface characteristic of a flux including CNTs will be described with reference to FIGS. 13A through 14B below.

Figure 13A:
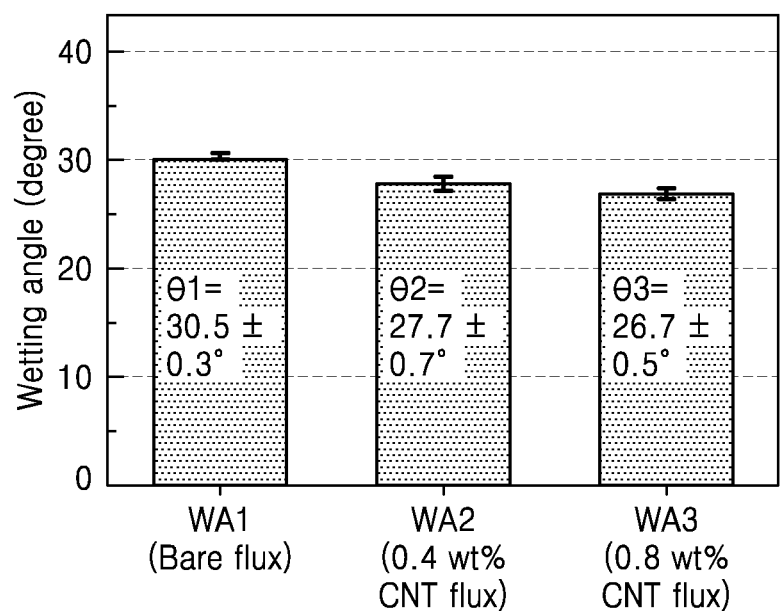
FIGS. 13A and 13B are graphs showing a wettability test result of a flux including CNTs.
Figure 13B:
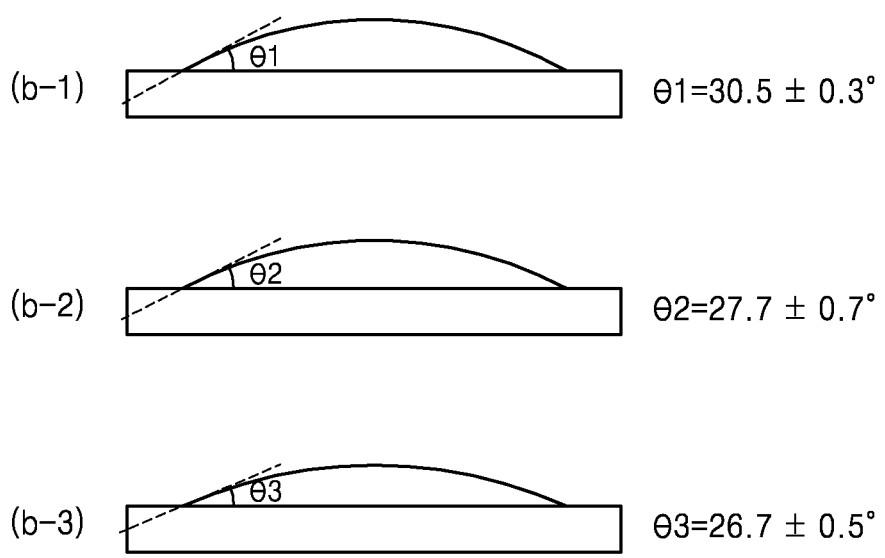

FIGS. 13A and 13B are graphs showing a wettability test result of a flux including CNTs. FIGS. 13A and 13B illustrate water contact angles measured with respect to a flux WA1 including no CNT, a flux WA2 including CNTs of 0.4 wt %, and a flux WA3 including CNTs of 0.8 wt %.

Referring to FIGS. 13A and 13B, the fluxes WA2 and WA3 including CNTs have respectively contact angles of θ2=27.7±0.7° and θ3=26.7±0.5°, whereas the flux WA1 including no CNT has a contact angle of θ1=30.5±0.3°. As shown in FIG. 13B, the flux WA2 including CNTs of 0.4 wt % (b-2) has a smaller contact angle than that of the flux WA1 including no CNT (b-1), and the flux WA3 including CNTs of 0.8 wt % (b-1) has the smallest contact angle. Thus, the flux WA2 including CNTs of 0.4 wt % and the flux WA3 including CNTs of 0.8 wt % may have enhanced wettability characteristics.

Figure 14A:
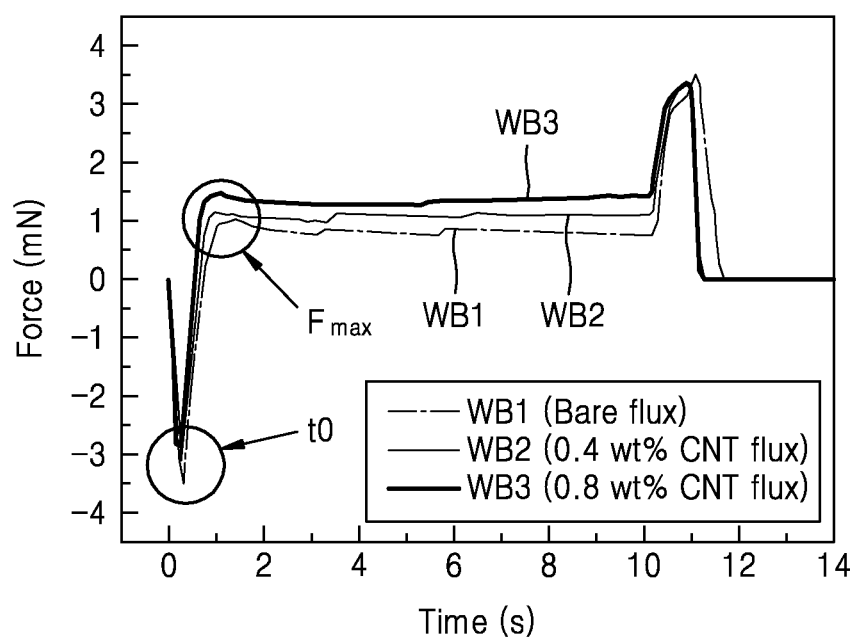
FIGS. 14A and 14B are graphs showing a wetting balance test result of a flux including CNTs.
Figure 14B:
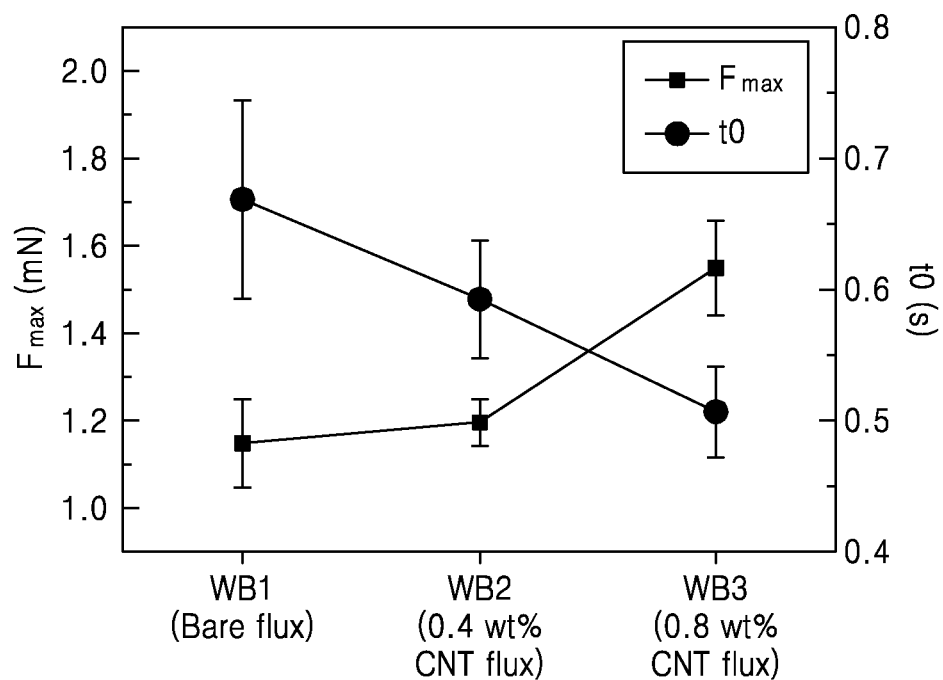

FIGS. 14A and 14B are graphs showing a wetting balance test result of a flux including CNTs. FIGS. 14A and 14B illustrate a ting time t0 and a maximum wetting force $F_{max}$ measured with respect to a flux WB1 including no CNT, a flux WB2 including CNTs of 0.4 wt %, and a flux WB3 including CNTs of 0.8 wt %.

Referring to FIGS. 14A and 14B, the flux WB2 including CNTs of 0.4 wt % and the flux WB3 including CNTs of 0.8 wt % have a less wetting time t0 than that of the flux WB1 including no CNT. The wetting time t0 refers to an index indicating how fast a sample is wetted by a solder. The wetting time t0 may be desired to have a value less than 1 second. The maximum wetting force $F_{max}$ refers to a force used by a sufficiently wet solder to pull the sample. The maximum wetting force may be desired to be increased. As shown in FIG. 14B, the fluxes WB2 and WB3 including CNTs may have further less wetting time t0 and further greater maximum wetting force $F_{max}$ than those of the flux WB including no CNT, and thus the fluxes WB2 and WB3 including CNTs may have enhanced wettability characteristic.

Figure 10:
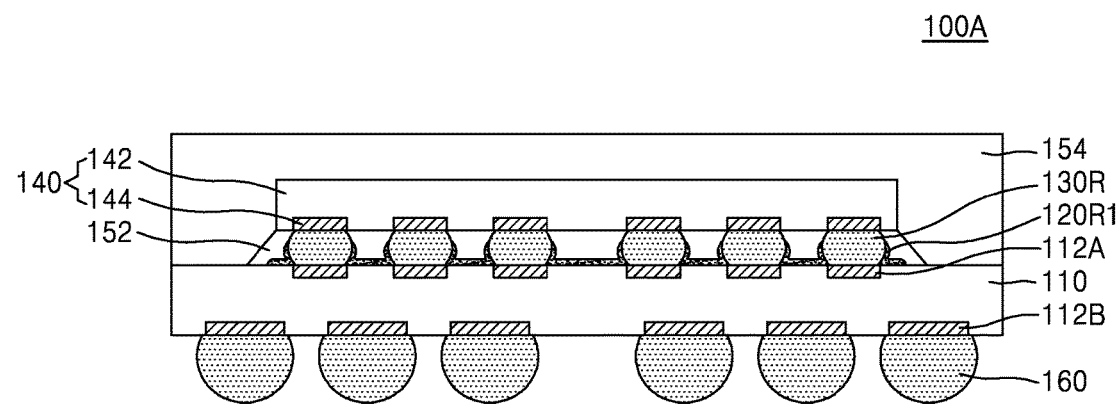
FIG. 10 is a cross-sectional view of a semiconductor package according to an example embodiment.

FIG. 10 is a cross-sectional view of a semiconductor package 100A according to an example embodiment.

Referring to FIG. 10, after a bonded structure of the semiconductor chip 140 and the substrate 110 is formed by performing processes described with reference to FIGS. 1 through 9, a cleaning process for cleaning the flux remaining layer 120R2 (see FIG. 9) attached to a lower surface (or a surface of the substrate 110 through which the second connection pad 112B is exposed) of the substrate 110 may be performed.

The cleaning process may be performed using a well-known flux cleaning agent. For example, the flux cleaning agent may be a water flux cleaning agent. For example, the cleaning process may be performed at a cleaning agent temperature ranging from about 20° C. to about 50° C. for several tens of seconds to several minutes.

The flux remaining layer 120R2 may be removed from the lower surface (or the surface of the substrate 110 through which the second connection pad 112B is exposed) of the substrate 110 and side walls of the second solder layer 160 through the cleaning process.

Meanwhile, the flux remaining layer 120R1 may be removed from an upper surface (or a surface of the substrate 110 through which the first connection pad 112A is exposed) of the substrate 110 in FIG. 10. In some example embodiments, before or after a process of mounting the semiconductor chip 140 onto the substrate 110, an additional cleaning process may be performed to remove the flux remaining layer 120R1 from the upper surface of the substrate 110 and side walls of the first solder layer 130R. In this case, the flux remaining layer 120R1 may not be disposed between the underfill layer 152 and the first solder layer 130R.

Figure 11:
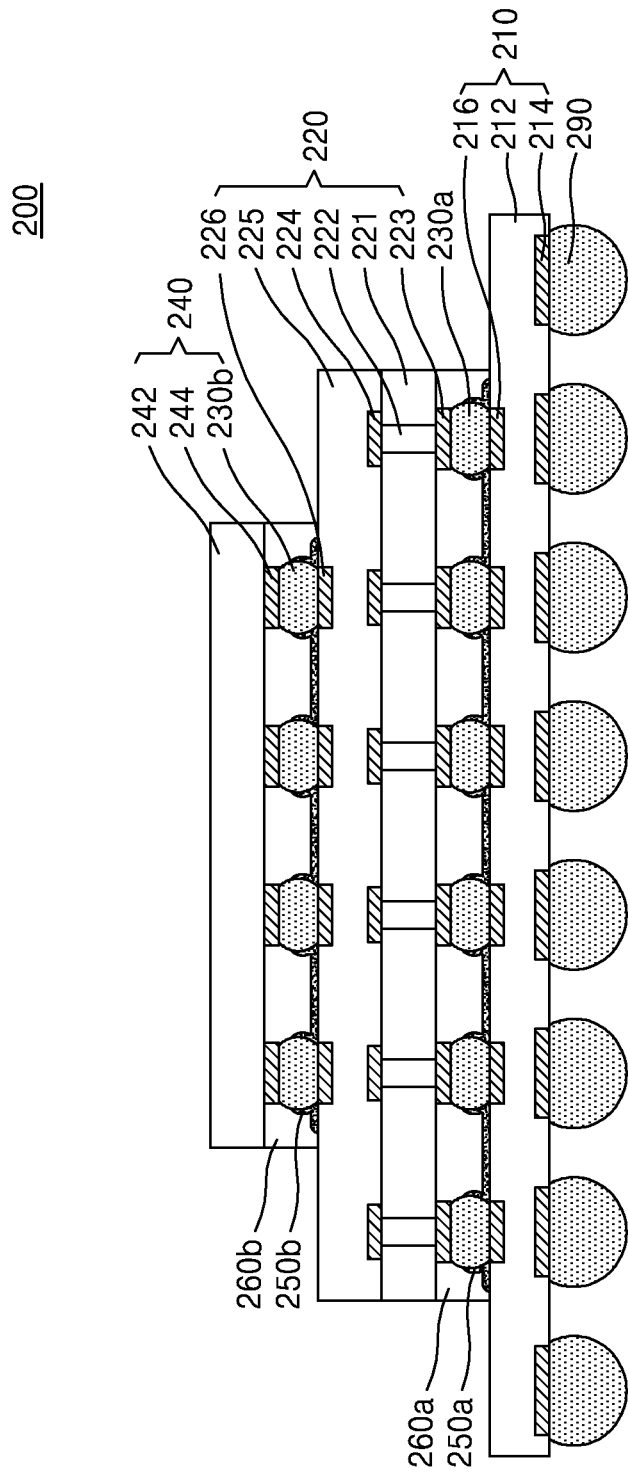
FIG. 11 is a cross-sectional view of a semiconductor package according to an example embodiment.

FIG. 11 is a cross-sectional view of a semiconductor package 200 according to an example embodiment.

Referring to FIG. 11, a first semiconductor chip 220 and a second semiconductor chip 240 may be sequentially stacked on a substrate structure 210, which includes a substrate 212. In this regard, the first semiconductor chip 220 may have a through substrate via (TSV) 222, and the second semiconductor chip 240 may be flip chip mounted on the first semiconductor chip 220.

The substrate 212 may be a PCB or a FPCB. A connection pad 216 may be provided on an upper surface of the substrate 212 to provide an electrical connection with the first semiconductor chip 220.

The connection pad 216 may be a conductive pad, for example, a metal pad. In some example embodiments, the connection pad 216 may include, for example, a copper (Cu) pad, nickel (Ni) pad, or an aluminum (Al) pad plated with nickel, but is not limited thereto.

A connection pad 214 for an electrical connection with an external device may be provided on a lower surface of the substrate 212. The connection pad 214 provided on the lower surface of the substrate 212 may also be the conductive pad like the connection pad 216 provided on the upper surface of the connection pad 214, and thus a redundant description thereof is omitted.

A solder layer 290 may be provided on the connection pad 214 for a connection with the external device. The solder layer 290 may be a tin (Sn) solder bump. In some example embodiments, the solder layer 290 may be a solder bump including silver (Ag) and/or copper (Cu) and having tin (Sn) as a main component, but is not limited thereto.

The first semiconductor chip 220 may include a semiconductor layer 221, the TSV 222, and a wiring layer 225. The wiring layer 225 may include a via pad 224 (as well as a via pad 223) connected to the TSV 222, a connection pad 226 for an electrical connection with the second semiconductor chip 240, and an internal wiring for electrically connecting the via pad 224 and the connection pad 226.

The semiconductor layer 221 is described in detail with reference to the semiconductor substrate 142 of FIG. 5, and thus a redundant description thereof is omitted.

The TSV 222 may have a structure in which an insulating layer, a seed layer, and a conductive layer are sequentially formed. The insulating layer may electrically insulate the conductive layer from the semiconductor layer 221. The insulating layer may include oxide, nitride, or oxynitride, for example, silicon oxide, silicon nitride, or silicon oxynitride. The conductive layer may include for example, metal. The conductive layer may include one or more metal, for example, aluminum (Al), gold (Au), beryllium (Be), bismuth (Bi), cobalt (Co), copper (Cu), hafnium (Hf), indium (In), manganese (Mn), molybdenum Mo), nickel (Ni), lead (Pb), palladium (Pd), platinum Pt), rhodium (Rh), rhenium (Re), ruthenium (Ru), tantalum (Ta), telryum (Te), titanium (Ti), tungsten (W), zinc (Zn), or zirconium (Zr). The insulating layer, the seed layer, and the conductive layer constituting the TSV 222 may be formed using chemical vapor deposition (CVD), plasma enhanced CVD (PE-CVD), high density plasma CVD (HDP-CVD), sputtering, metal organic CVD (MOCVD), or atomic layer deposition (ALD).

As shown in FIG. 11, via pads 223 and 224 may be respectively provided on upper and lower portions of the TSV 222 and may be formed simultaneously with or separately from the TSV 222. Materials of the via pads 223 and 224 may be the same as or different from that of the TSV 222.

The substrate 210 and the first semiconductor chip 220 may be electrically connected by a solder layer 230*a*. The solder layer 230*a* is described in detail with reference to FIG. 4, and thus a detailed description thereof is omitted.

As shown in FIG. 11, the second semiconductor chip 240 may be flip chip mounted on an upper portion of the first semiconductor chip 220. The second semiconductor chip 240 provided on the upper portion of the first semiconductor chip 220 may include a semiconductor substrate 242 and a connection pad 244 provided in an active surface of the semiconductor substrate 242. The semiconductor substrate 242 may be manufactured using various materials described with reference to the semiconductor substrate 142 of FIG. 5. Various semiconductor devices described with reference to the semiconductor substrate 142 of FIG. 5 may be provided in the active surface of the semiconductor substrate 242.

The via pad 224 (or alternatively, connection pad) and the connection pads 226 may be provided on an upper surface of the first semiconductor chip 220 and a lower surface of the second semiconductor chip 240, respectively, to correspond to each other. The corresponding connection pads 226 and 224 may be electrically connected by a solder layer 230*b*. The solder layer 230*b* is described in detail with reference to FIG. 4, and thus a detailed description thereof is omitted.

Flux remaining layers 250*a* and 250*b* may be disposed on side walls of the solder layers 230*a* and 230*b* and upper and lower surfaces of the first semiconductor chip 220 around the solder layers 230*a* and 230*b*. The flux remaining layers 250*a* and 250*b* are described in detail with reference to FIG. 4, and thus detailed descriptions thereof are omitted.

Underfill layers 260*a* and 260*b* may be formed between the substrate 210 and the first semiconductor chip 220 and/or between the first semiconductor chip 220 and the second semiconductor chip 240.

While the inventive concepts have been particularly shown and described with reference to some example embodiments thereof, it will be understood that various changes in form and details may be made therein without departing from the spirit and scope of the following claims.

What is claimed is:

1. A method of manufacturing a semiconductor package, the method comprising:
   coating a flux on a connection pad provided on a first surface of a substrate, the flux including carbon nanotubes (CNTs);
   placing a solder ball on the connection pad coated with the flux;
   forming a solder layer attached to the connection pad from the solder ball through a reflow process; and
   mounting a semiconductor chip on the substrate such that the solder layer faces a connection pad in the semiconductor chip,
   wherein an amount of the CNTs in the flux ranges from about 0.01 wt % to about 1 wt %.

2. The method of claim 1, wherein a hydrophilic functional group is attached to the CNTs in the flux.

3. The method of claim 2, wherein the hydrophilic functional group is at least one selected from a group consisting of a hydroxy group, an alkoxy group, a nitro group, a cyano group, an amino group, an azido group, an amidino group, a hydrazino group, a hydrazono group, a carbonyl group, a carbamyl group, a thiol group, an allylamin group, an ether group, an ester group, a carboxyl group, salt of the carboxyl group, a sulfonic acid group, a trimethoxysilane group (—Si(OCH$_3$)$_3$), and a trichlorosilane group (—SiCl$_3$).

4. The method of claim 1, wherein the amount of the CNTs in the flux ranges from about 0.4 wt % to about 0.8 wt %.

5. The method of claim 1, wherein the CNTs comprise at least one selected from a group consisting of single-wall CNTs, double-wall CNTs, multi-wall CNTs, and CNT ropes.

6. The method of claim 1, wherein coating the flux includes forming a contact angle of less than 60 degrees between the connection pad and the flux.

7. The method of claim 1, wherein the substrate is a printed circuit board (PCB), a flexible printed circuit board (FPCB), or an interposer.

8. The method of claim 1, wherein forming the solder layer includes forming a flux remaining layer by the flux remaining on side walls of the solder layer or an upper surface of the connection pad.

9. The method of claim 8, further comprising:
   after forming the solder layer, performing a cleaning process for at least partially removing the flux remaining layer.

10. The method of claim 8, further comprising:
    after mounting the semiconductor chip on the substrate, performing a cleaning process for at least partially removing the flux remaining layer.

11. A method of manufacturing a semiconductor package, the method comprising:
    coating a flux on a connection pad provided on a first surface of a substrate, the flux including carbon nanotubes (CNTs), a hydrophilic functional group being attached to the CNTs;
    placing a solder ball on the connection pad coated with the flux;
    forming a solder layer attached to the connection pad from the solder ball through a reflow process; and
    mounting a semiconductor chip on the substrate such that the solder layer faces a connection pad provided in the semiconductor chip.

12. The method of claim 11, wherein an amount of the CNTs in the flux ranges from about 0.4 wt % to about 0.8 wt %.

13. The method of claim 11, wherein coating the flux includes forming a contact angle of less than 60 degrees between the connection pad and the flux.

14. The method of claim 11, wherein forming the solder layer includes forming a flux remaining layer by the flux remaining on side walls of the solder layer or an upper surface of the connection pad.

15. A method of manufacturing a semiconductor package, the method comprising:
    providing a connection pad on a surface of a substrate;

coating a flux on the connection pad, the flux including a flux agent having carbon nanotubes (CNTs) and a hydrophilic functional group attached to the CNTs;

placing a solder ball on the connection pad coated with the flux;

performing a reflow process to the solder ball such that the solder ball contacts the connection pad through the flux and the flux at least partially covers lower sides of sidewalls of the solder ball and the substrate; and mounting a semiconductor chip on the substrate such that a reflowed structure of the solder ball faces a connection pad in the semiconductor chip.

16. The method of claim 15, wherein the hydrophilic functional group is at least one selected from a group consisting of a hydroxy group, an alkoxy group, a nitro group, a cyano group, an amino group, an azido group, an amidino group, a hydrazino group, a hydrazono group, a carbonyl group, a carbamyl group, a thiol group, an allylamin group, an ether group, an ester group, a carboxyl group, salt of the carboxyl group, a sulfonic acid group, a trimethoxysilane group ($-Si(OCH_3)_3$), and a trichlorosilane group ($-SiCl_3$).

17. The method of claim 15, further comprising:
performing a cleaning process for at least partially removing the flux coated on the connection pad, the performing occurring after performing the reflow process to the solder ball.

18. The method of claim 15, wherein an amount of the CNTs in the flux is about 1 wt % or less.

19. The method of claim 18, wherein the amount of the CNTs in the flux ranges between about 0.4 wt % and about 0.8 wt %.

* * * * *

UNITED STATES PATENT AND TRADEMARK OFFICE
CERTIFICATE OF CORRECTION

PATENT NO. : 10,076,801 B2
APPLICATION NO. : 15/443347
DATED : September 18, 2018
INVENTOR(S) : Min-woo Song et al.

Page 1 of 1

It is certified that error appears in the above-identified patent and that said Letters Patent is hereby corrected as shown below:

On the Title Page

Item (73) Assignees:
Reads:
Samsung Electronics Co., Ltd.
Gyeonggi-Do (KR)

Should read:
 Samsung Electronics Co., Ltd.**
Gyeonggi-Do (KR); and
Korea Advanced Institute of Science and Technology
Daejeon-si (KR) **

Signed and Sealed this
Twenty-second Day of October, 2019

Andrei Iancu
*Director of the United States Patent and Trademark Office*